United States Patent [19]

Oka et al.

[11] Patent Number: 4,601,627

[45] Date of Patent: Jul. 22, 1986

[54] APPARATUS FOR TRANSFERRING THIN SHEET-LIKE ARTICLE SUCH AS WAFERS

[75] Inventors: Masahiko Oka; Masami Nishida, both of Hikone, Japan

[73] Assignee: Dainippon Screen Manufacturing Co., Ltd., Kyoto, Japan

[21] Appl. No.: 585,695

[22] Filed: Mar. 2, 1984

[30] Foreign Application Priority Data

Apr. 23, 1983 [JP] Japan .................................. 58-72009

[51] Int. Cl.⁴ ............................................. B65H 5/10
[52] U.S. Cl. ................................. 414/225; 198/468.2; 294/119.1; 294/907; 414/741; 414/744 A
[58] Field of Search ........... 414/222, 225, 736, 744 A, 414/741, 751; 901/6, 7, 39, 33–35, 45; 294/88, 86 R, 67 BB, 103 R, DIG. 2, 119.1, 907, 902, 86.4, 103.1; 271/265; 29/832–834, 740; 198/486, 468.2

[56] References Cited

U.S. PATENT DOCUMENTS

| | | | |
|---|---|---|---|
| 2,636,770 | 4/1953 | Cornwell | 294/103.1 |
| 2,882,085 | 4/1959 | Abbott | 294/103 X |
| 3,618,800 | 11/1971 | Collins | 294/88 |
| 3,682,327 | 8/1972 | Winne | 414/744 A X |
| 4,256,429 | 3/1981 | Dwyer | 294/103.1 X |
| 4,286,380 | 9/1981 | Blount | 901/39 X |
| 4,479,673 | 10/1984 | Inaba et al. | 294/86 R X |

Primary Examiner—Donald W. Underwood
Attorney, Agent, or Firm—Millen & White

[57] ABSTRACT

An apparatus for transferring thin sheet-like articles such as wafers is disclosed. The apparatus is provided with opposed pairs of contact elements capable of adjusting the distance between said pairs of contact elements. The thin sheet-like articles are transferred one by one from a transfer passage to a treating station while they are clamped between said pairs of contact elements by a transfer mechanism movable between the transfer passage and the treating station.

11 Claims, 7 Drawing Figures

APPARATUS FOR TRANSFERRING THIN SHEET-LIKE ARTICLE SUCH AS WAFERS

BACKGROUND OF THE INVENTION

The present invention relates to an apparatus for transferring thin sheet-like articles, such as glass mask substrates and wafers, one by one from a transfer passage to a predetermined postiion at a surface treating device such as a spinner.

Heretofore, in the semiconductor industry, glass mask substrates have been produced by coating glass substrates with a photoresist, drying the same, exposing a predetermined mask pattern, and performing an etching treatment. In this case, it is essential that the photoresist film be of uniform thickness; otherwise, the etched mask pattern itself could not be made accurately. Accordingly, they are carefully coated one by one by a rotary surface treating device such as a spinner. This surface treating device, as is known in the art, has a spindle carrying a spindle head on its upper end adapted to suck and hold a substrate to whose surface a photoresist is applied by rotating said spindle. A need exists in a device for transferring and feeding substrates to this rotary surface treating device.

Accordingly, it is an object of the present invention to provide a thin sheet-like article transferring apparatus capable of adjusting itself to the shape and size of a thin sheet-like article to grip it in transferring and feeding thin sheet-like articles of various shapes and sizes from a transfer passage to a predetermined treating device.

BRIEF SUMMARY OF THE INVENTION

According to the present invention, there is provided an apparatus for transferring thin sheet-like article such as wafers wherein thin sheet-like articles fed in one by one through a transfer passage are transferred and fed to a device or station for treating said thin sheet-like articles.

The apparatus is characterized by providing with opposed pairs of contact elements which support the sheetlike articles, means for adjusting the distance between said pairs of contact elements, and means for moving said pairs of contact elements from the transfer passage to said treating station.

In a preferred embodiment, said apparatus further comprises an abutting member adapted to press the outer edge of a thin sheet-like article while it is clamped between said opposed pair of contact elements.

DESCRIPTION OF THE PREFERRED EMBODIMENTS

Figure 7:
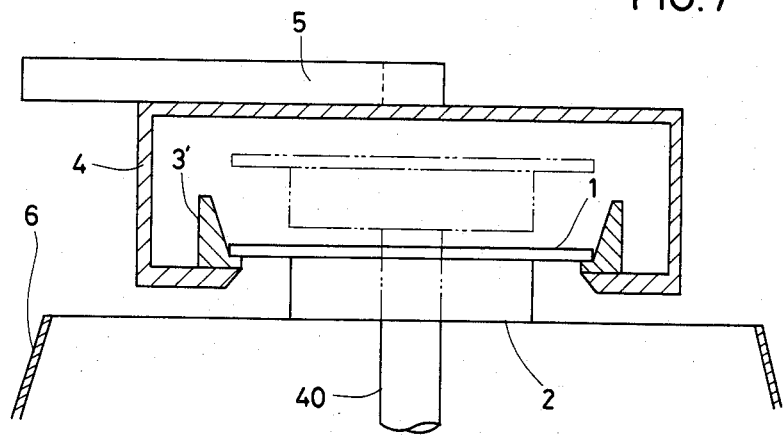
FIG. 7 is a side sectional view taken along the line F—F in FIG. 6.
Figure 6:
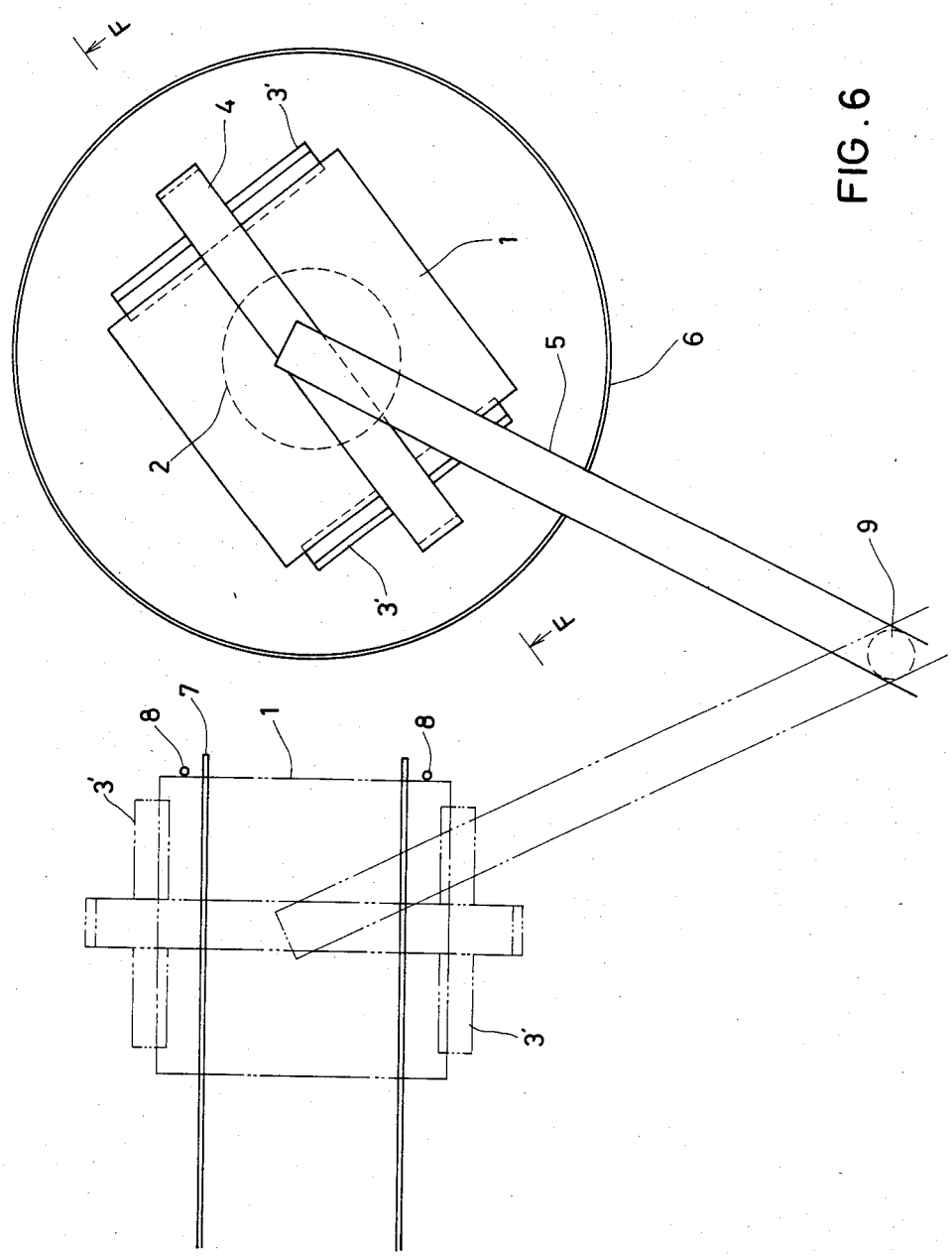
FIG. 6 is a schematic plan view of a conventional example.

In order to understand the present invention, a prior art apparatus for use in transferring a substrate to a treating station will be described. As shown in FIGS. 6 and 7, two opposed edges of a substrate 1 are placed on mounts 3' fixed to an arm 5 and a flame 4, and the substrate 1 is transferred to a position above a spinner head 2 by rotating the arm 5 in a horizontal plane around a shaft 9 (or by translating the arm 5).

More particularly, when the arm 5 is positioned at transfer belts 7, the mounts 3' are positioned so that they are parallel to and horizontally outside the two transfer belts 7 and so that the substrate supporting surfaces of the mounts 3' are below the level of the transfer belts 7. In this condition, the substrate 1 fed in as it is transferred on the transfer belts 7 passes over the mounts 3' and abut against positioning pins 8, whereupon it stops. At this time, a photosensor (not shown) senses that the substrate 1 has reached the terminal end of the transfer passage, and the resulting detection signal causes the arm 5 to rise, thereby moving the substrate 1 from the transfer belts 7 onto the mounts 3'. With the substrate 1 placed on the mounts 3', the arm 5 is rotated in the horizontal plane through a predetermined angle to bring the substrate 1 to a position above the spinner head 2. Subsequently, the spinner head 2 rises from within a spinner cup 6 to raise the substrate 1 from the mounts 3' (see the two-dot chaine lines in FIG. 7). The arm 5 is then rotated in the horizontal plane through the predetermined angle, whereupon the transfer device is lowered to its original position shown in the two-dot chaine lines in FIG. 6. Subsequently, the spinner head 2 sucks and holds the substrate 1 and lowers into the spinner cup 6, within which the substrate 1 is surface-treated while being rotated.

As is clear from the foregoing description, in the conventional thin sheet-like article transferring apparatus, since the mounts 3' are fixed to the frame 4, it has been necessary to change the frame 4 or arm 5 to adjust the distance between the mounts 3' in accordance with the shape and size of the substrate 1.

A preferred embodiment of the thin sheet-like article transferring apparatus according to the present invention will now be described in detail with reference to FIG. 1 through 5.

Figure 1:
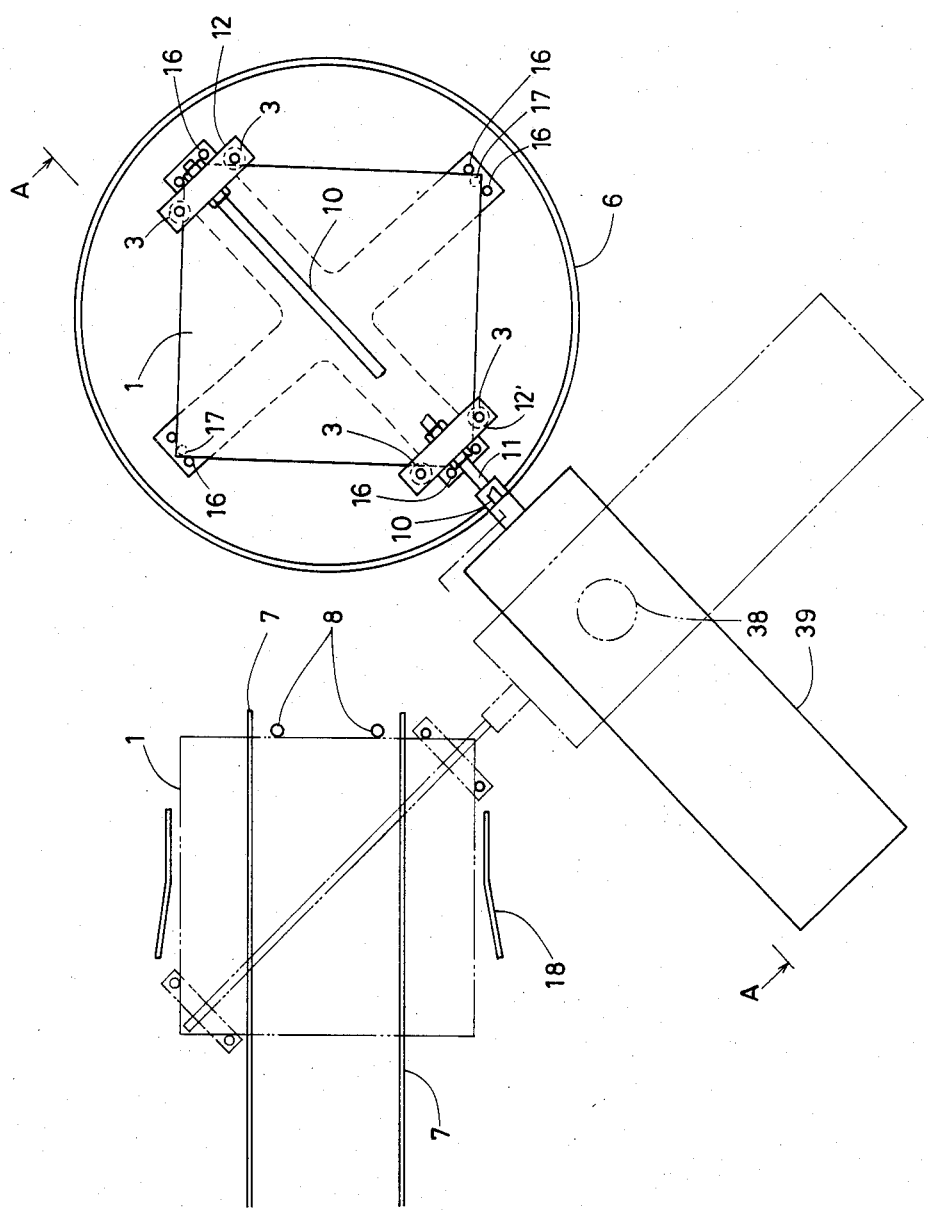
FIG. 1 is a schematic plan view of an embodiment of the present invention.

Thin sheet-like articles or substrates 1 placed on transfer belts 7 are transferred one by one until they are stopped by guides 18 and stoppers 8, whereby they are successively positioned at a predetermined position at the terminal end of the transfer passage. Contact elements 3 serve to grip a substrate 1 and, for example, four such contact elements are provided, as shown in FIG. 1. They are arranged in opposed pairs in the advancing and retracting direction of the contact elements 3. Of these contact elements 3, the ones positioned remote from a gripping unit 39 are suspended through a frame 12 fixed to the front end of an advancing and retracting rod 10 by lock nuts, while those contact elements 3 which are positioned closer thereto are likewise suspended from an advancing and retracting rod 11 through a frame 12'. All these contact elements 3 are of the same shape; for example, each contact element is composed of a bar 50 and a cone 51 fixed to the front end of said bar. When the substrate 1 is placed, the outer edge of said substrate is contacted with the outer peripheries of the bars 50 and the bevel surfaces of the cones 51, so that the area of contact is minimized. Further, the advancing and retracting movement of the rods 10 and 11 within the gripping unit 39 is controlled and for this purpose the advancing and retracting rod 10 is disposed above the rod 11; thus, the bars 50 for the advancing and retracting rod 10 are greater in length than those for the advancing and retracting rod 11 (see FIG. 4).

Figure 3:
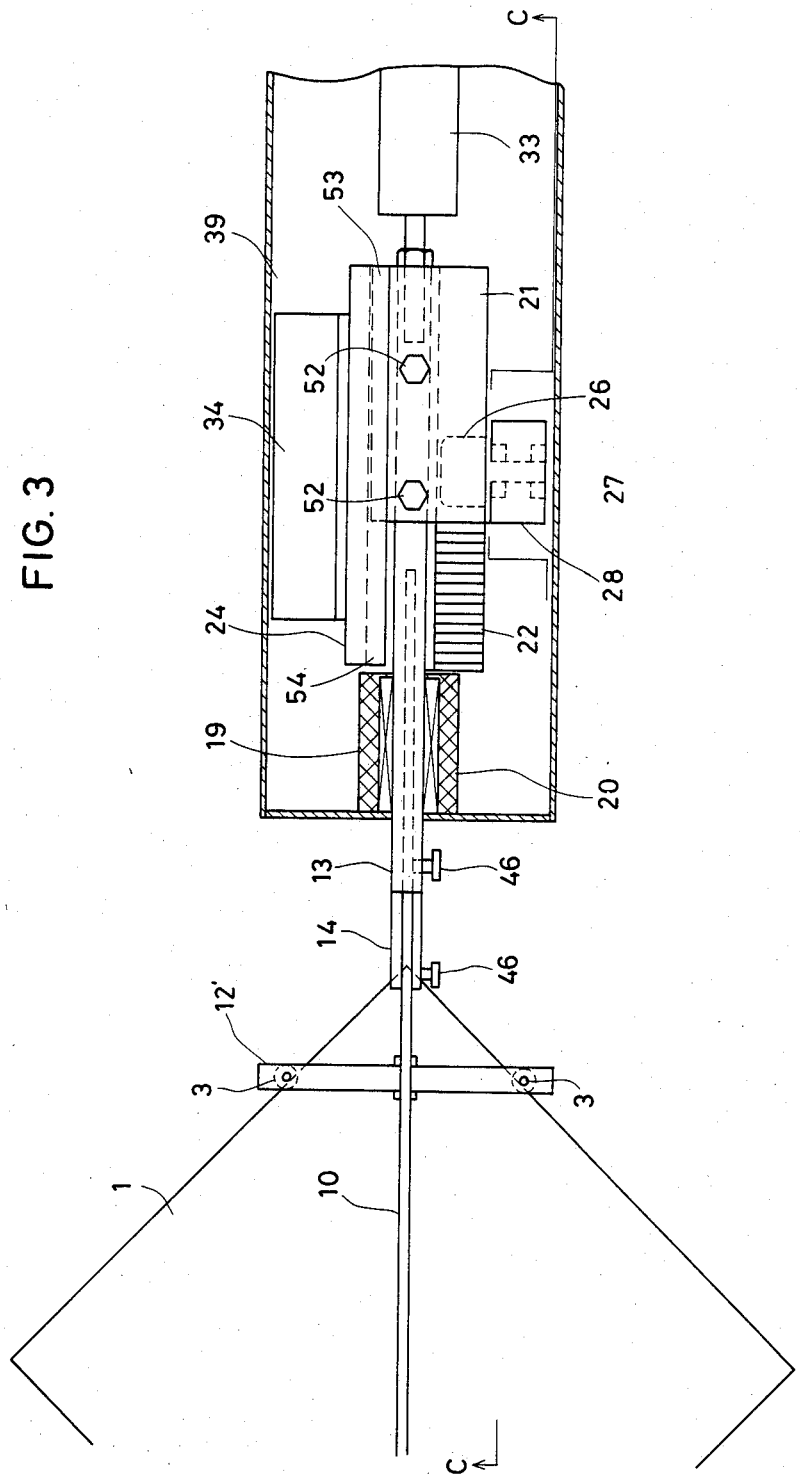
FIG. 3 is a partial sectional plane view taken along the line B—B in FIG. 2.
Figure 4:
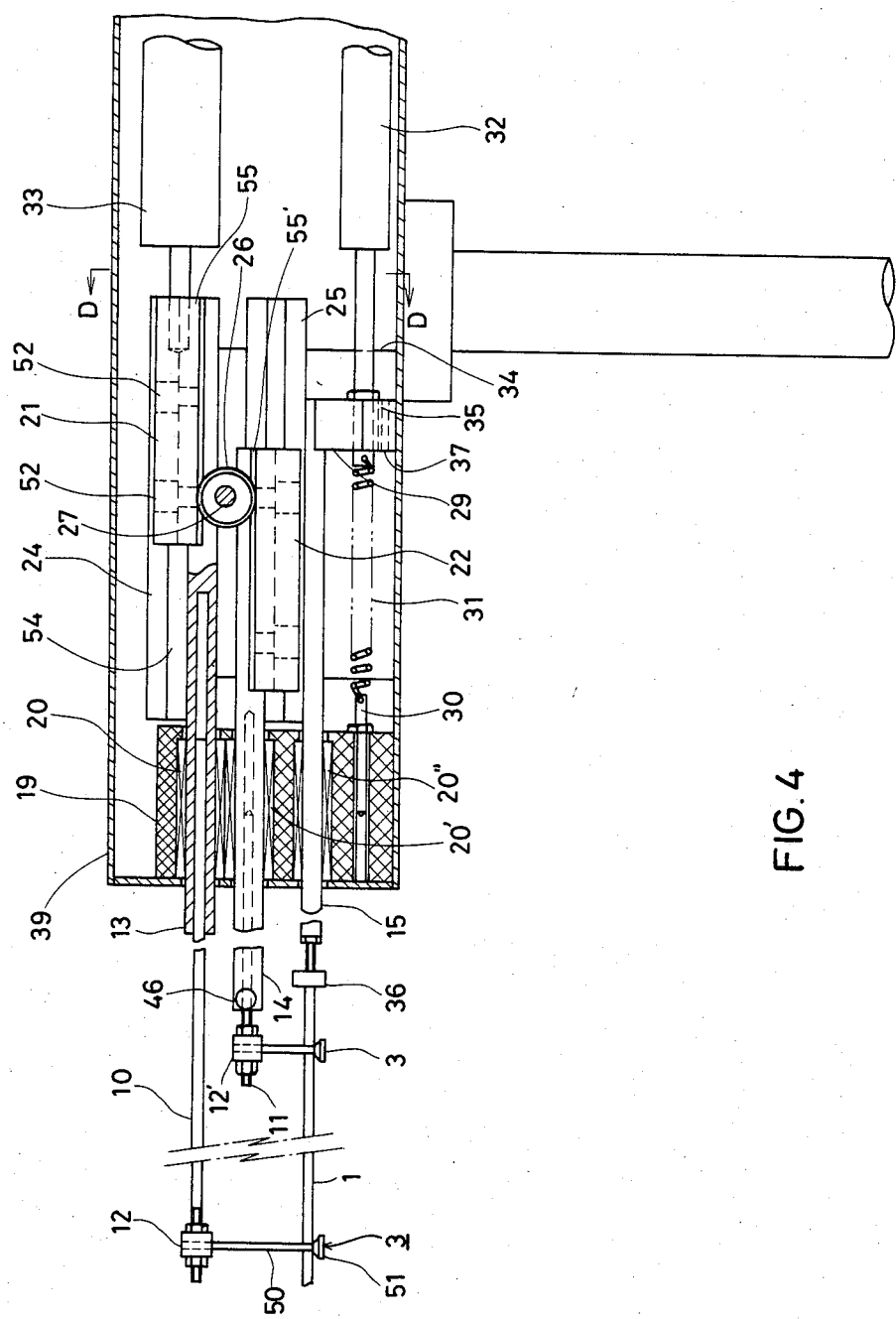
FIG. 4 is a side sectional view taken along the line C—C in FIG. 3.

As for the control of the advancing and retracting movement of the rods 10 and 11, as shown in FIG. 3, the advancing and retracting rod 10 is inserted in an advancing and retracting shaft 13 and fixed therein by a laterally inserted bolt 46 so that the inserted position of the rod can be changed as desired. Similarly, the advancing and retracting rod 11 is inserted in an advancing and retracting shaft 14 and fixed therein by a bolt 46. The advancing and retracting shaft 13 is journaled in a bearing 20 in a block 19 contained in the gripping unit 39 and is horizontally slidable. A slider 21 is fixed to the inner end portion of said shaft 13 within the unit by bolts 52, as shown in FIGS. 3 and 4. One side of said slider 21 is formed with a projection 53 engaging a recess 54 formed in a guider 24, so that the slider 21 is slidable along the recess 54.

The opposite side of the slider 21 is formed with a rack 55 meshing with a pinion 26 at its upper side. Further, the rod of an air cylinder 33 is fixed to the side of the slider 21 opposite to its side attached to the advancing and retracting shaft. As the rod of the air cylinder 33 is extended and retracted, the advancing and retracting shaft 13 horizontally comes in and out of the gripping unit 39 while being guided by the guider 24 and bearing 20.

On the other hand, the advancing and retracting shaft 14, as in the case of said advancing and retracting shaft 13, is journaled in a bearing 20', and a slider 22 fixed to the inner end of said shaft 14 within the unit is guided by a guider 25 and a rack 55' cut in the slider 22 is meshing with the aforesaid pinion 26 at its lower side, so that the slider 22 will be horizontally slid in the direction opposite to that for the slider 21. Thus, when the rod of the air cylinder 33 is reciprocated, the slider 21 is moved in the slide direction of said rod, while the slider 22 is moved in the direction opposite to said slide direction, with the result that the movement of the contact elements 3 provided on the advancing and retracting rod 10 is opposite to that of the contact elements provided on the advancing and retracting rod 11.

Figure 5:
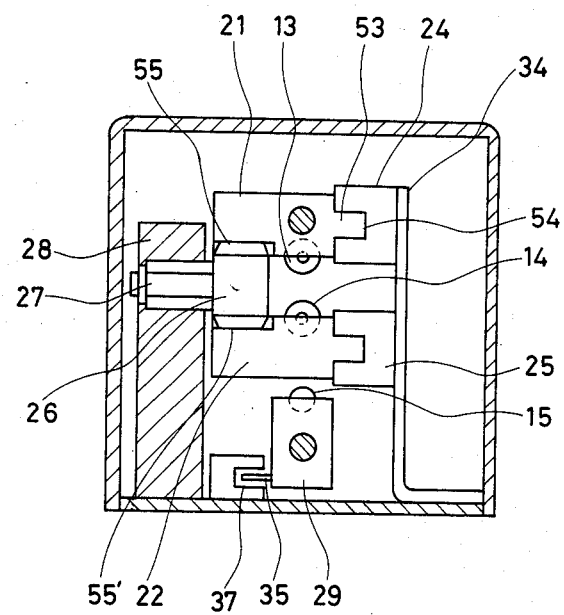
FIG. 5 is a side sectional view taken along the line D—D in FIG. 4.

The shaft 27 of the pinion 26, as shown in FIG. 5, is inserted and rotatably held in a support 28 projecting inside the gripping unit 39, and the guiders 24 and 25 are fixed to the frame 34, as shown in the same figure.

Figure 2:
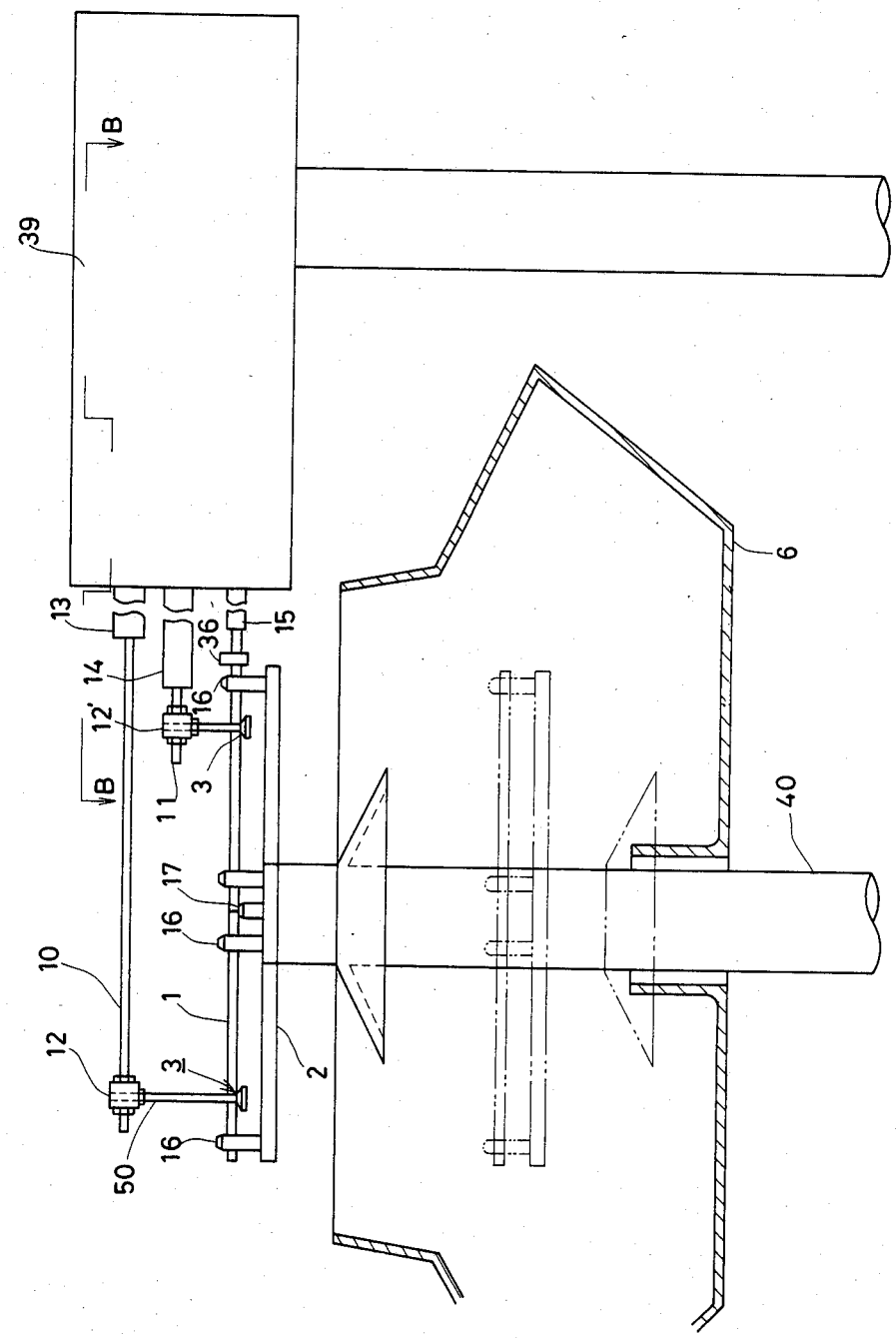
FIG. 2 is a partial sectional side view taken along the line A—A in FIG. 1.

Further, in the present embodiment, as shown in FIGS. 2 and 4, besides the contact elements 3, there is movably provided an abutment 36 for preventing the substrate 1 from becoming loosened when it is gripped by the contact elements 3. That is, as shown in FIG. 4, the abutment 36 adapted to abut against the outer edge of the substrate 1 is fixed by thread or any other suitable means to the front end of an advancing and retracting shaft 15 journaled in a bearing 20", and the inner end of the advancing and retracting shaft 15 within the unit has a slider 29 fixed thereto. One surface of said slider 29 has fixed thereto the front end of the rod of an air cylinder 32 and the opposite surface thereof has locked thereto one end of a tension spring 31, the other end of said spring 31 being locked to an adjuster 30 threadedly fitted in said block 19. Thus, when the air cylinder 32 is not operating, the advancing and retracting shaft 15 is pulled in the direction which presses the substrate 1. Further, a light-shielding plate 35 attached to said slider 29, as is clear from FIG. 5, is arranged so that the postiion at which the abutment 36 abuts against the substrate 1 can be detected by a photosensor 37.

The operation of the present embodiment will now be described. In FIG. 1, the substrate 1 on the transfer belts 7 is fed in and stopped by the stopper pins 8. The gripping unit 39, which at this time is in the two-dot chaine line position in FIG. 1, has extended the rod of the air cylinder 33 and opened the opposed contact elements 3, and the latter are positioned above the level of the substrate 1 by means of a lifting device (not shown) for a shaft 38.

When an unillustrated sensor senses that the substrate 1 fed abuts against the stoppers 8, the lifting device for the shaft 38 lowers the gripping unit 39 until the cones 51 of the contact elements 3 are positioned below the level of the substrate 1.

Subsequently, the air cylinder 33 within the gripping unit 39 is actuated to retract its rod. Thus, since the sliders 21 and 22 slide in mutually opposite directions, the contact elements 3 of the advancing and retracting shaft 10 are horizontally moved in the same direction as the retracting direction of the rod of the air cylinder 33, while the contact elements 3 of the advancing and retracting shaft 11 are moved in the direction opposite to the retracting direction of the rod of the air cylinder 33, so that the outer edge of the substrate 1 is gripped by the bars 50 of the contact elements 3. Concurrently, since the air pressure in the air cylinder 32 is released, the rod of the air cylinder 32 is withdrawn by the tension spring 31.

Therefore, the abutment 36 quickly abuts against the outer edge of the substrate 1 to urge the substrate 1 against the contact elements 3 by the action of the tension spring 31 so as to eliminate the gap between the substrate 1 and the contact elements 3. That is, the substrate 1 is locked by the contact elements 3 of the advancing and retracting shaft 10 and the abutment 36.

The speed at which the abutment 36 abuts against the substrate 1 by the action of the air cylinder 32 can be adjusted by controlling the rate of discharge of air by a speed controller placed in the air discharge system of said air cylinder 32 to adjust the pulling speed of the tesnsion spring 31 in advance so as to control the rate of horizontal movement of the advancing and retracting shaft 15 toward the left in FIG. 4

In this case, the light-shielding plate 35 attached to the slider 29 shields the light beam directed to the photosensor 37, the latter sensing that the substrate 1 is gripped by the contact elements 3. In addition, it is possible to provide an arrangement such that if the light beam directed toward the photosensor 37 is not shielded by the light-shielding plate 35, that is, if the substrate 1 fails to abut against the abutment 36 and hence it is not firmly gripped, the gripping unit 39 is prevented from proceeding to the next process or an alarm is produced.

When the photosensor 37 senses that the contact elements 3 roughly grip the substrate 1 and more firmly grip it by means of the abutment 36, the lifting device (not shown) for the shaft 38 lifts the gripping unit 39 to raise the substrate 1 from the transfer belts 7.

Subsequently, the shaft 38 is rotated through a predetermined angle to horizontally move the substrate 1 to a position above the spinner head 2. Therefore, the gripping unit 39 is lowered and concurrently therewith the rod of the air cylinder 32 is retracted to remove the abutment 36 from the outer edge of the substrate 1 to loosen the grip. Then, the spindle 40 of the spinner head 2 is lifted to bring the pins 17 of the spinner head 2 into contact with the lower surface of the substrate 1. Thereupon, the air cylinder 33 within the gripping unit 39 is actuated to open the opposed contact elements 3 to release the substrate 1. The substrate 1 is placed on the low pins 17, four in all, projecting from the ends of the spinner head 2 and its horizontal movement is prevented by two high pins 16 (8 in all) associated with each low pin 17.

When the substrate 1 is thus placed on the spinner head 2, the spinner head 2 is lowered by the lifting device for the spindle 40 and the substrate 1 is subjected to a predetermined surface treatment at a predetermined rotational speed for a predetermined time, during which time the gripping unit 39 is returned to its original waiting position at the transfer belts 7. Upon completion of the predetermined surface treatment of the substrate 1, the spinner head 2 is lifted and then a delivery unit (not shown) of the same construction as the aforesaid gripping unit 39 is opposed to the spinner head 2 and grips the substrate 1 by its contact elements to transfer said substrate 1 to, e.g., transfer belts (not shown) for delivery use. Concurrently, said gripping unit 39 starts to transfer the next substrate to be surface-treated from the transfer belts 7 to the spinner head 2. In this manner the transfer apparatus according to the present invention is capable of reliably transferring and feeding substrates one by one from the transfer belts 7 to the spinner head 2.

The invention has the following advantages.

(1) Since only the outer edge of a thin sheet-like article such as a wafer is gripped by the contact elements, there is no danger of contaminating the back of the thin sheet-like article or damaging the article.

(2) Even if the size or shape of the thin sheet-like article is changed, the article can be gripped by the opposed contact elements; thus, any thin sheet-like article can be firmly gripped and transferred.

(3) Since the thin sheet-like article is gripped and fed to a treating station by the opposed contact elements, the positioning of the article on the treating station can be accurately effected.

(4) When an abutment member adapted to press the outer edge of the thin sheet-like article is used besides the opposed contact elements, deviation due to vibration during transfer of the thin sheet-like article can be avoided and hence the positioning of the article on the treating device can be accurately effected.

(5) Even if the thin sheet-like article is a glass mask substrate, since the contact region is other than the mask pattern effective portion, contamination of the face and back of the board can be avoided and the yield of semiconductor wafers after exposure can be greatly increased.

What is claimed is:

1. An apparatus for transferring thin sheet-like articles, such as wafers, wherein thin sheet-like articles fed in one by one through a transfer passage are transferred and fed to a device for treating said thin sheet-like articles, said apparatus comprising: opposed pairs of contact elements,
   wherein said contact elements each comprise a vertically depending bar having attached to its lower end a truncated cone having a bevelled surface whereby the outer edge of said sheet-like article is supported by the outer perifery of said bar and the bevelled surface of said cone, and
   means for adjusting the distance between said opposed pairs of contact elements, said adjusting means including a pair of moving rods reciprocating in parallel in opposite directions to each other, said opposed pair of contact elements being carried by one end of each of said moving rods.

2. The apparatus as set forth in claim 1 further comprising an abutting member adapted to press against the outer edge of said thin sheet-like article.

3. An apparatus for transferring thin sheet-like articles, such as wafers, wherein thin sheet-like articles fed in one by one through a transfer passage are transferred and fed to a device for treating said thin sheet-like articles, said apparatus comprising:
   opposed pairs of contact elements, wherein said contact elements each comprise a vertically depending bar having attached at its lower end a truncated cone having a bevelled surface, whereby the outer edge of said sheet-like article is supported by the outer perifery of said bar and the bevelled surface of said cone, and
   means for adjusting the distance between said opposed pairs of contact elements, said adjusting means including a pair of moving rods reciprocating in parallel in opposite directions to each other, said opposed pair of contact elements being carried by one end of each of said moving rods, the other end of each of said moving rods being connected to rack means which mesh with a common pinion disposed therebetween.

4. The apparatus as set forth in claim 3, wherein one of said rack means is operatively connected to an air cylinder means by a connecting rod for reciprocating itself and the other rack means in opposite directions to each other.

5. The apparatus as set forth in claim 4 further comprising an abutting member adapted to press the outer edge of said thin sheet-like article.

6. The apparatus as set forth in claim 5, wherin said abutting member is carried by a slidable rod normally biassed toward said thin sheet-like article.

7. The apparatus as set forth in claim 2, wherein said abutting member is carried by a slidable rod normally biassed toward said thin sheet-like article.

8. The apparatus as set forth in claim 2, further comprising means for producing a signal when said abutting member is not in proper engagement with said thin sheet-like article whereby the signal may be used for preventing further operation of the apparatus or producing an alarm.

9. An apparatus for transferring thin sheet-like articles, such as wafers, wherein said thin sheet-like articles fed in one by one through a transfer passage are transferred and fed to a device for treating said thin sheet-like articles, said apparatus comprising: opposed pairs of contact elements and means for adjusting the distance between said pairs of contact elements, said contact elements each including a vertically depending bar connected to said adjusting means and having attached to its lower end a truncated cone having a bevelled surface for supporting the outer edge of the sheet-like article in cooperation with the outer perifery of said bar; means for moving said pairs of contact elements from the transfer passage to a predetermined position at the treating device, an abutting member adapated to press against the outer edge of said thin sheet-like article, and the abutting member being carried by a slidable rod normally biased toward said thin sheet-like article.

10. The apparatus of claim 1, further including means for rendering each moving rod adjustable.

11. The apparatus of claim 2, further including means for rendering each moving rod adjustable.

* * * * *